(12) United States Patent
Takagi

(10) Patent No.: US 7,974,804 B2
(45) Date of Patent: Jul. 5, 2011

(54) REGISTRATION DETECTION SYSTEM

(75) Inventor: Makoto Takagi, Yokohama (JP)

(73) Assignee: Nikon Corporation, Tokyo (JP)

( * ) Notice: Subject to any disclaimer, the term of this patent is extended or adjusted under 35 U.S.C. 154(b) by 1163 days.

(21) Appl. No.: 11/661,418

(22) PCT Filed: Oct. 17, 2005

(86) PCT No.: PCT/JP2005/019058
§ 371 (c)(1),
(2), (4) Date: Feb. 28, 2007

(87) PCT Pub. No.: WO2006/046429
PCT Pub. Date: May 4, 2006

(65) Prior Publication Data
US 2008/0215275 A1    Sep. 4, 2008

(30) Foreign Application Priority Data
Oct. 26, 2004    (JP) .................................. 2004-310917

(51) Int. Cl.
*G06F 19/00* (2011.01)
(52) U.S. Cl. ......... 702/95; 702/85; 250/491.1; 250/398; 382/151
(58) Field of Classification Search .................... 702/95, 702/85; 250/491.1, 398; 382/151
See application file for complete search history.

(56) References Cited

U.S. PATENT DOCUMENTS

| 4,253,112 | A | * | 2/1981 | Doemens ........................ 348/87 |
| 4,327,292 | A | * | 4/1982 | Wang et al. ................ 250/491.1 |
| 4,431,923 | A | * | 2/1984 | Wang et al. ................ 250/491.1 |
| 5,805,290 | A | * | 9/1998 | Ausschnitt et al. ........... 356/401 |

FOREIGN PATENT DOCUMENTS

| JP | 11-186358 A | 7/1999 |
| JP | 2000-150353 A | 5/2000 |
| WO | 03/077291 A1 | 9/2003 |
| WO | 2005/083756 A1 | 9/2005 |

* cited by examiner

*Primary Examiner* — Drew A Dunn
*Assistant Examiner* — Hien X Vo
(74) *Attorney, Agent, or Firm* — Arent Fox LLP

(57) ABSTRACT

A registration detection system realizes both substrate-by-substrate correction and highly accurate correction of an exposure process. Therefore, the registration detection system includes: the first detection apparatus installed on a pathway to a collection in a transport container of substrates taken out of the transport container, after passing at least an exposure process and a development process, registration-detects the substrates after passing the development process at multiple points; the second detection apparatus outside the pathway, and performing registration-detecting the substrates at more points than the first detection apparatus when the substrates after passing the first detection apparatus and collected in the transport container are taken out from the transport container again; and a generation unit (image processing parts of the aforementioned detection apparatuses) that generates compensation data for the exposure process based on detection results by the first detection apparatus and detection results by the second detection apparatus.

31 Claims, 2 Drawing Sheets

REGISTRATION DETECTION SYSTEM

CROSS-REFERENCE TO RELATED APPLICATION

This application is a U.S. National Stage application claiming the benefit of prior filed International Application Number PCT/JP2005/019058, filed Oct. 17, 2005, in which the International Application claims a priority date of Oct. 26, 2004 based on prior filed Japanese Application Number 2004-310917, the entire contents of which are incorporated herein by reference.

TECHNICAL FIELD

The present invention relates to a registration detection system that performs registration detection of a plurality of patterns formed on different layers of a substrate, and more particularly, to a registration detection system suitable for the registration detection in manufacturing processes of semiconductor devices, liquid crystal display devices, and the like.

BACKGROUND ART

In manufacturing processes of semiconductor devices, liquid crystal display devices, and the like, a circuit pattern is transferred to a resist layer after a known lithography process, and by performing processing such as etching via the resist pattern, the circuit pattern is transferred to a predetermined material film (pattern forming process). Then, by repeatedly executing the pattern forming process many times, the circuit patterns of various material films are stacked on a substrate (a semiconductor wafer or a liquid crystal substrate), whereby circuits of the semiconductor device or the liquid crystal display device are formed.

Further, in the above-described manufacturing processes, for accurate registration the circuit patterns of the various material films (for improving a product yield), detection of positional discrepancy of the resist pattern on the substrate follows the lithography process and precedes the processing process, during each of the pattern forming processes (see, for example, a patent document 1). This is registration detection of a circuit pattern of a base layer formed in an immediately preceding pattern forming process (hereinafter, referred to as a "base pattern") and the resist pattern. The result of the registration detection is used for quality judgment of the substrate and so on.

Generally, the registration detection is performed in a stand-alone apparatus independent from a lithography system (including an exposure apparatus). Therefore, substrates as detection objects after passing through the lithography process are transported to a registration detection apparatus while put in a transport container such as a cassette (that is, in a unit of lot). Then, in the registration detection apparatus, part of the substrates in the lot are sampled to undergo the registration detection, and the result of the registration detection is outputted in a unit of lot. Thereafter, quality of the substrates is judged in a unit of lot, and the substrates are transported in a unit of lot to a subsequent process (processing process or the like if judged as good, or to a reproduction process or a discard process if judged as bad.

Further, the result of the registration detection for some lot A is not only used for the quality judgment of the lot A but also fed back to the exposure process in the lithography process to be used for the correction of the exposure process for a subsequent lot B (the same product name and process name as those of the lot A), in order to improve a nondefective ratio of the subsequent lot B.

The correction of the exposure process is processing to finely adjust parts (an alignment system, an AF system, and so on) of the exposure apparatus in advance to reduce discrepancy in position and size between a latent image of a circuit pattern formed on a mask (reticle) and a base pattern (hereinafter, referred to as a "process offset") when the latent image is imaged on a resist layer. The process offset of the exposure process varies little by little in accordance with a time-dependent change of the parts of the exposure apparatus and also varies depending on the state of the base layer of each substrate. Therefore, to avoid an increase in the process offset, the correction of the exposure process is required.

As a result of the correction of the exposure process, a latent image with a small process offset is imaged on the resist layer in the exposure process for the subsequent lot B. Then, after the development process, a resist pattern according to the latent image is formed on the base pattern, and the registration of the resist pattern in the subsequent lot B also becomes good. The result of the registration detection for the lot B is fed back to the exposure process to be used for the correction of the exposure process for a subsequent lot C, similarly to the above.

In this manner, conventionally, the detection result outputted in a unit of lot from the stand-alone registration detection apparatus is fed back to the exposure process, and based on the result of the registration detection on some lot, the exposure process for a subsequent lot is corrected, and such correction of the exposure process is repeated in a unit of lot. Therefore, in the lithography process for a plurality of lots with the same product name and the same process name, it is possible to reduce the process offset of the exposure process every time a lot is changed, so that an increase in the process offset can be avoided.

Patent document 1: Japanese Unexamined Patent Application Publication No. 2000-150353

DISCLOSURE OF THE INVENTION

Problems to be Solved by the Invention

In a case where the detection result outputted in a unit of lot from the stand-alone registration detection apparatus is fed back to the exposure process, the exposure process is corrected in a unit of lot as described above, and is not corrected in a unit of each substrate in the lot. In the future, further progress in microfabrication of circuit patterns in accordance with higher integration of semiconductor devices and the like will create a demand for higher registration accuracy, and therefore, delicate correction of the exposure process will be required, for example, for each substrate.

To correct the exposure process for each substrate without lowering a throughput, it is necessary to install the registration detection apparatus in the lithography system (including the exposure apparatus), to provide the registration detection apparatus as an in-line apparatus. In this case, due to the restriction of space for built-in installation, it is difficult to install the stand-alone apparatus as it is, and a driving part, a vibration isolation system, and so on of a detection stage have to be downsized. Further, it is necessary to reduce a required time per one substrate by decreasing the number of measurement points of each of the substrates, with processing speed given a higher priority over accuracy of the registration detection. However, such a structure cannot realize higher accuracy.

It is an object of the present invention to provide a registration detection system which can realize delicate and highly accurate correction of an exposure process.

Means for Solving the Problems

A registration detection system of the present invention includes: a first detection apparatus that is installed on a pathway to a collection in a transport container of substrates that are taken out of the transport container, after passing at least through an exposure process and a development process, and performs registration detection of a resist pattern and a base pattern of the substrates after passing through the development process, at multiple points of the substrates; a second detection apparatus situated outside of the pathway, and performing registration detection of the resist pattern and the base pattern of the substrates at more points of the substrates than the first detection apparatus; and a generation unit that generates compensation data for the exposure process based on results of the registration detection performed by the first detection apparatus and results of the registration detection performed by the second detection apparatus.

Further, in the registration detection system described above, the generation unit generates a lower-order component of the compensation data based on the results of the registration detection performed by the first detection apparatus, and generates a higher-order component of the compensation data based on the results of the registration detection performed by the second detection apparatus.

Further, in the registration detection system described above, the generation unit first generates the lower-order component and afterward calculates the respective components of the compensation data based on the results of the registration detection performed by the second detection apparatus, with the lower-order component being removed from the respective components to generate the higher-order component.

Further, in the registration detection system described above, the first detection apparatus is placed inside an application/development apparatus that applies resist prior to the exposure process and develops the resist after the exposure process, and the second detection apparatus is placed outside the application/development apparatus.

Effect of the Invention

According to the registration detection system of the present invention, it is possible to correct an exposure process delicately and accurately.

BRIEF DESCRIPTION OF THE DRAWINGS

The nature, principle, and utility of the invention will become more apparent from the following detailed description when read in conjunction with the accompany drawings in which like parts are designated by identical reference numbers, in which.

BEST MODE FOR CARRYING OUT THE INVENTION

Hereinafter, an embodiment of the present invention will be described in detail by using the drawings.

Figure 1:
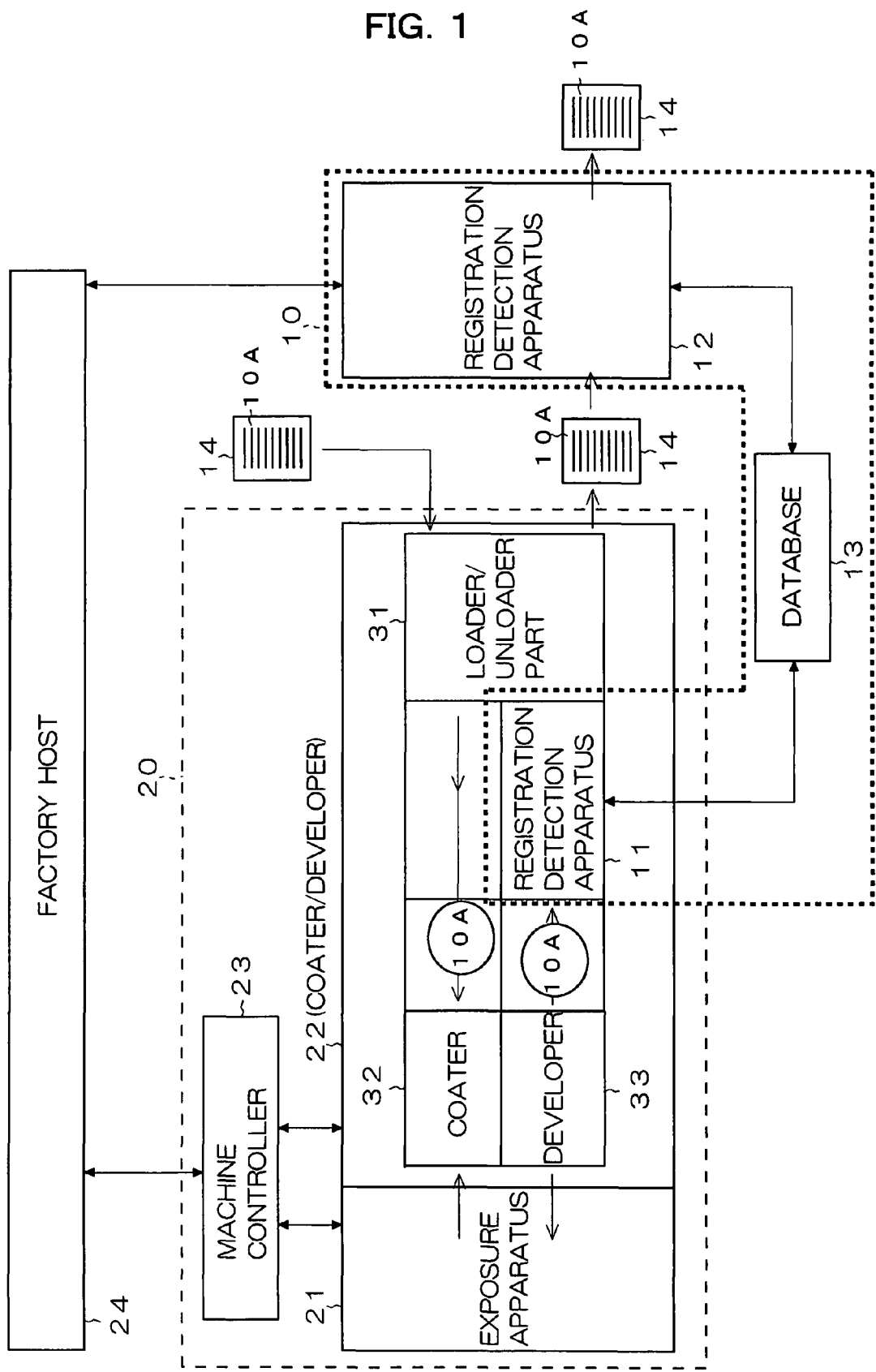
FIG. 1 is a block diagram showing the structure of a registration detection system 10 of this embodiment.

As shown in FIG. 1, a registration detection system 10 of this embodiment includes: a registration detection apparatus 11 installed in a lithography system 20; a stand-alone registration detection apparatus 12 independent from the lithography system 20; and a database 13. The registration detection system 10 performs registration detection of a plurality of patterns formed on different layers of substrates 10A (semiconductor wafers, liquid crystal substrates, and the like) in manufacturing processes of semiconductor devices, liquid crystal display devices, and so on.

Here, the substrates 10A are transported to the lithography system 20 while put in a transport container 14 such as a cassette (that is, in a unit of lot), and after passing through a lithography process (to be described later) there, are transported to the stand-alone registration detection apparatus 12 while put in the transport container 14 again. The transport container 14 is thus moved by an automatic transport apparatus (not shown) or an operator. The transport container 14 is capable of housing a plurality of (for example 25 pieces of) the substrates 10A, and is sometimes called a carrier.

The lithography system 20 will be described before the registration detection 10 of this embodiment is concretely described.

In the lithography system 20, an exposure apparatus 21 and a coater/developer 22 are adjacently installed, and a transport mechanism (not shown) of the substrates 10A is installed therebetween. In the coater/developer 22, a loader/unloader part 31, a coater 32, and a developer 33 are mounted, and further the built-in registration detection apparatus 11 in the registration detection system 10 of this embodiment is mounted, and the transport mechanism (not shown) of the substrates 10A is also installed. Thus, inside the lithography system 20, the apparatuses (11, 21, 31 to 33) are mutually in-line connected by the not-shown transport mechanism.

In the lithography system 20, the loader/unloader part 31 is an apparatus for loading and unloading the transport container 14 housing the substrates 10A. The coater 32 is an apparatus which coats each of the substrates 10A in the transport container 14 (that is in a lot) with resist before an exposure process in the exposure apparatus 21. The developer 33 is an apparatus to develop the resist of each of the substrates 10A after the exposure process. The built-in registration detection apparatus 11 is an apparatus to perform the registration detection (to be described in detail later) of the substrates 10A after a development process. Further, the exposure apparatus 21 is an apparatus to image a latent image of a circuit pattern formed on a mask (reticle), on a resist layer of each of the substrates 10A.

In the lithography system 20 as structured above, when the transport container 14 is carried into the loader/unloader part 31, each of the substrates 10A taken out from the transport container 14 is transported to the exposure apparatus 21 after passing through a resist coating process in the coater 32, is transported to the built-in registration detection apparatus 11 after passing through the exposure process in the exposure apparatus 21 and the development process in the developer 33, and is collected in the transport container 14 after passing through a detection process in the registration detection apparatus 11.

The built-in registration detection apparatus 11 is installed in the lithography system 20 to correct the exposure process substrate by substrate. Installing the registration detection apparatus 11 in the lithography system 20 makes it possible to perform the registration detection of the substrate 10A during a period in which the substrate 10A taken out from the transport container 14 passes through the lithography process (the resist coating process, the exposure process, the development process, and so on) to be thereafter collected in the transport container 14, which makes it possible to feed back the result of the registration detection to the exposure process.

The correction of the exposure process is processing to finely adjust parts (an alignment system, an AF system, and so on) of the exposure apparatus 21 in advance so as to reduce a process offset between a latent image of a circuit pattern and a base pattern when the latent image is imaged on the resist layer. The process offset of the exposure process varies little by little in accordance with a time-dependent change of the parts of the exposure apparatus 21, and also varies depending on the state of the base layer of each of the substrates 10A. Incidentally, the state of the base layer of the substrate 10A is influenced by a time-dependent change or the like of a deposition apparatus and a CMP apparatus and is often different among the substrates 10A. Therefore, as the microfabrication of circuit patterns further progresses in accordance with higher integration of semiconductor devices and the like, the substrate-by-substrate correction of the exposure process becomes necessary.

A machine controller 23 is connected, as an upper-order apparatus, to the exposure apparatus 21 and the coater/developer 22. The machine controller 23 controls the exposure apparatus 21 and the coater/developer 22 based on instructions from a factory host 24 to instruct the contents of processing in the apparatuses (11, 21, 31~33), the timing of the loading/unloading of the substrates 10A, the correction of the exposure process, and so on. The factory host 24 is in charge of process control of the whole factory (including the lithography system 20 and the registration detection system 10 of this embodiment).

Next, the registration detection system 10 of this embodiment will be concretely described.

As described above, the built-in registration detection apparatus 11 is disposed in the coater/developer 22 and is installed on a pathway where the substrate 10A taken out from the transport container 14 passes through the lithography process to be collected in the transport container 14. Further, the stand-alone registration detection apparatus 12 is disposed outside the coater/developer 22 (that is, outside the pathway). Further, the built-in registration detection apparatus 11 is connected to the database 13 via a not-shown communication means and the stand-alone registration detection apparatus 12 is also connected to the database 13 via a not-shown communication means, whereby a network is formed as a whole.

Both of the substrate 10A as an object of detection by the built-in registration detection apparatus 11 and the substrate 10A as an object of detection by the stand-alone registration detection apparatus 12 have undergone the development and have resist patterns formed on surfaces thereof. Then, the registration detection of the resist pattern and a base pattern in the substrate 10A is performed outside and inside the lithography system 20 by the built-in registration detection apparatus 11 and the stand-alone registration detection apparatus 12.

Further, many measurement points are prepared in each of the substrates 10A for the registration detection. Positions of the measurement points are, for example, four corners of each shot area of the substrate 10A. At each of the measurement points, a resist mark representing a reference position of the resist pattern and a base mark representing a reference position of the base pattern are formed.

Figure 2:
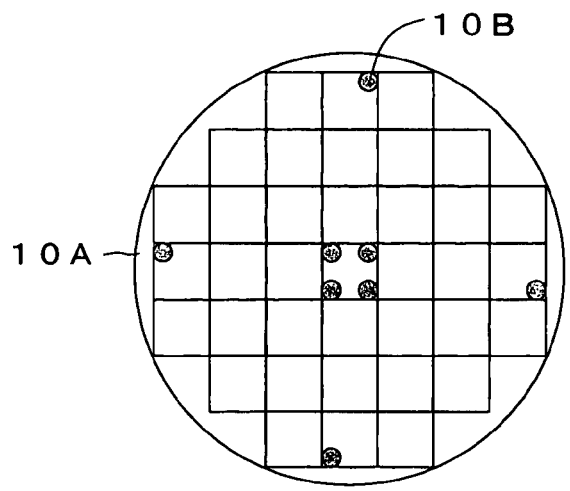
FIG. 2 is a view to explain measurement points 10B of a substrate 10A in a built-in registration detection apparatus 11.

In the registration detection system 10 of this embodiment, the built-in registration detection apparatus 11 calculates a relative discrepancy amount (registration detection amount) between the resist mark and the base mark at each of the 8 measurement points 10B shown in FIG. 2 out of many measurement points of the substrate 10A to perform the registration detection. The stand-alone registration detection apparatus 12 calculates a relative discrepancy amount (registration discrepancy amount) between the resist mark and the base mark at each of the 52 measurement points 10C shown in FIG. 3 out of the many measurement points of the substrate 10A to perform the registration detection. That is, the number of the measurement points of the substrate 10A set for the built-in registration detection apparatus 11 is different from that set for the stand-alone registration detection apparatus 12, the latter being larger than the former.

Figure 3:
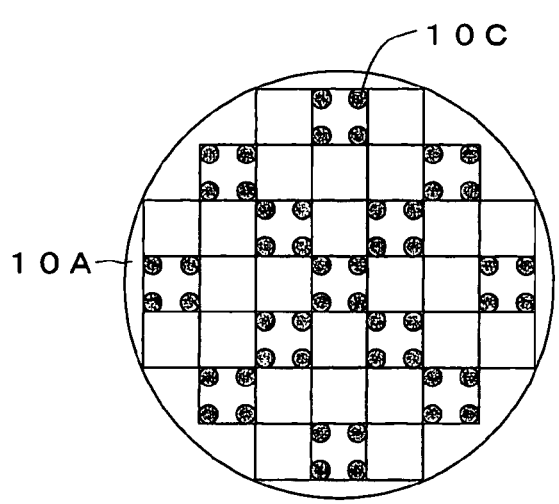
FIG. 3 is a view to explain measurement points 10C of the substrate 10A in a stand-alone registration detection apparatus 12.
Figure 4:
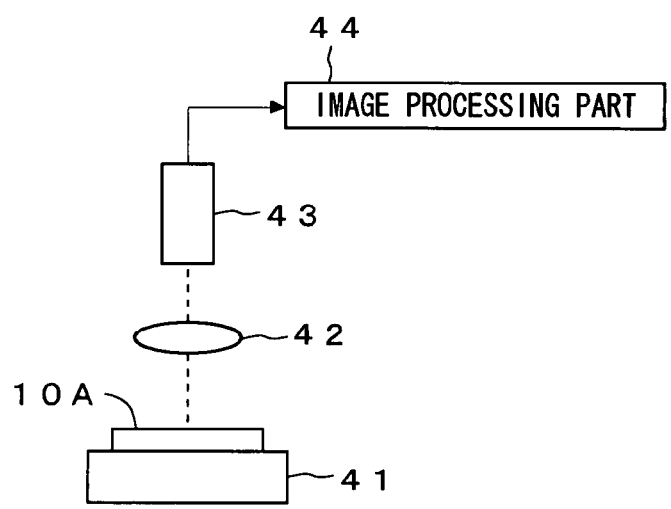
FIG. 4 is a view showing the schematic structure of the built-in registration detection apparatus 11 and the stand-alone registration detection apparatus 12.

Further, in each of the built-in registration detection apparatus 11 and the stand-alone registration detection apparatus 12, a detection stage 41, an optical system 42, a camera 43, and an image processing part 44 shown in FIG. 3 are provided. The detection stage 41 supports the substrate 10A. The optical system 42 forms an optical image of each local area (the measurement point 10B or the measurement point 10C) of the substrate 10A. The camera 43 captures the optical image of the substrate 10A by a not-shown image sensor to output an image capturing signal to the image processing part 44.

When acquiring the image capturing signal from the camera 43, the image processing part 44 converts the optical image to a digital image, applies predetermined signal processing to this image, and calculates a registration discrepancy amount at the measurement point 10B or the measurement point 10C. Further, the image processing part 44 generates compensation data (to be described later) for the exposure apparatus 21 based on the registration discrepancy amount at each of the measurement points 10B or each of the measurement points 10C of the substrate 10A. The image processing part 44 of the built-in registration detection apparatus 11 and the image processing part 44 of the stand-alone registration detection apparatus 11 as a whole correspond to a "generation unit".

As described above, the built-in registration detection apparatus 11 and the stand-alone registration detection apparatus 12 have the same basic structure. However, in the built-in registration detection apparatus 11, a driving part, a vibration isolation system, and so on of the detection stage 41 are smaller than those of the stand-alone registration detection apparatus 12, due to the restriction of space for built-in installation in the lithography system 20. Therefore, processing capability of the built-in registration detection apparatus 11 is lower than that of the stand-alone registration detection apparatus 12.

In the built-in registration detection apparatus 11 with a lower processing capability, the number of the measurement points of each of the substrates 10A (see FIG. 2) is decreased with processing speed given a higher priority over accuracy of the registration detection, thereby reducing a required time per one substrate. The built-in registration detection apparatus 11 is an apparatus which is provided for realizing substrate-by-substrate correction of the exposure process.

Further, in the stand-alone registration detection apparatus 12 with a higher processing capability, the number of the measurement points of each of the substrates 10A is increased (see FIG. 3) with accuracy of the registration detection given a higher priority over processing speed, thereby enhancing accuracy of the registration detection. The stand-alone registration detection apparatus 12 is an apparatus which is provided for realizing higher accuracy of the correction of the exposure process and performs the registration detection at more points than the built-in registration detection apparatus 11.

Further, the database 13 connected to the above-structured built-in registration detection apparatus 11 and stand-alone registration detection apparatus 12 stores a recipe for the built-in registration detection apparatus 11 and a recipe for the stand-alone registration detection apparatus 12 in advance. The recipe for the registration detection apparatus 11 is a file in which positional information of each of the measurement points 10B (FIG. 2) of the substrate 10A and so on are registered. The recipe for the registration detection apparatus 12 is a file in which the positional information of each of the measurement points 10C (FIG. 3) of the substrate 10A and so on are registered. Each of the recipes is stored in correspondence to the kind of lot (combination of the product name and the process name). Further, the compensation data for the exposure apparatus 21 generated by the image processing part 44 of the built-in registration detection apparatus 11 is also stored in the database 13 in correspondence to the product name, the process name, and the lot number.

Next, the procedure for processing the substrate 10A in the lithography system 20 and the detection procedure for the substrate 10A in the registration detection system 10 of this embodiment will be described.

When the transport container 14 is set in the loader/unloader part 31 of the coater/developer 22, this is notified to the factory host 24 via the machine controller 23. The factory host 24 refers to the product name, the process name, and so on of the set transport container 14 and instructs, to the machine controller 23, resist coating criteria, exposure criteria, development criteria, detection criteria, and so on suitable for the substrates 10A in the transport container 14. At this time, the factory host 24 outputs the product name, the process name, and the lot number together with the various criteria to the machine controller 23.

Based on the instruction from the factory host 24, the machine controller 23 gives instructions to the exposure apparatus 21 and the coater/developer 22 and also gives an instruction to the not-shown transport mechanism. Consequently, as instructed from the factory host 24, the substrate 10A is taken out of the transport container 14 in the loader/unloader part 31, the substrate 10A is coated with resist in the coater 32, the latent image of the circuit pattern is formed on the resist layer in the exposure apparatus 21, the resist layer is developed in the developer 33, the registration detection (to be described next in detail) is performed in the built-in registration detection apparatus 11, and the substrate 10A is collected in the transport container 14.

In the built-in registration detection apparatus 11, based on the instruction from the factory host 24, the recipe for the registration detection apparatus 11 (the file including the positional information of each of the measurement points 10B in FIG. 2) corresponding to the product name and the process name of the current lot is read from the database 13.

Then, when the substrate 10A after passing through the development process is placed on the detection stage 41, the measurement points 10B are aligned in sequence in a field of view of the apparatus according to the positional information registered in the recipe, and the registration detection is performed at the 8 measurement points 10B. Specifically, an image of each of the measurement points 10B is acquired and registration discrepancy amounts (X1, Y1) at each of the measurement points 10B are calculated based on the image.

The registration discrepancy amounts (X1, Y1) are stored in a memory in the image processing part 44 in correspondence to positional coordinates (x, y) of each of the measurement points 10B. The registration discrepancy amounts (X1, Y1) correspond to "results of the registration detection performed by the first detection apparatus" in the claims.

Further, in the built-in registration detection apparatus 11, linear models represented by the following expressions (1), (2) are applied to the combination of the registration discrepancy amounts (X1, Y1), which are found at each of the 8 predetermined measurement points 10B, and the positional coordinates (x, y) of the measurement point 10B. $k_1 \sim k_6$ in the expressions (1), (2) are correction coefficients, which will be described later, and correspond to lower-order components of the compensation data for the exposure apparatus 21.

$$X1 = k_1 + k_2 \cdot x + k_3 \cdot y \quad (1)$$

$$Y1 = k_4 + k_5 \cdot x + k_6 \cdot y \quad (2)$$

Then, the measurement results (the combination of the registration discrepancy amounts (X1, Y1) and the positional coordinates (x, y)) totally at the 8 points are analyzed according to the linear models, and the lower-order components (correction coefficients $k_1 \sim k_6$) of the compensation data for the exposure apparatus 21 are generated so as to reduce the influence of variation in the measurement results (that is, approximate residual errors by the linear models) to a minimum by using a least squares method or the like. A major cause of the lower-order components is thought to be the expansion/contraction at the time of thermal processing (that is, the exposure process) for the substrate 10A.

The correction coefficient $k_1$ is an offset component in an X direction of the registration discrepancy amounts (X1, Y1). The correction coefficient $k_2$ is a scaling component in the X direction. The correction coefficient $k_3$ is a rotation component of the X axis. The correction coefficient $k_4$ is an offset component in a Y direction. The correction coefficient $k_5$ is a scaling component in the Y direction. The correction coefficient $k_6$ is a rotation component of the Y axis.

Further, the generation of the lower-order components (correction coefficients $k_1 \sim k_6$) of the compensation data by the application of the linear models is performed for inter-shot components (wafer components) and in-shot components of the substrate 10A. In the generation for the inter-shot components, the positional coordinates (x, y) are coordinate values with respect to a center of the substrate 10A as an origin. In a case of the generation for the in-shot components, the positional coordinates (x, y) are coordinate values with respect to a center of each shot of the substrate 10A as an origin.

In this embodiment, as shown in FIG. 2, to generate the lower-order components (correction coefficients $k_1 \sim k_6$) for the inter-shot components of the substrate 10A, the measurement results at the five shots are used, and to generate the lower-order components (correction coefficients $k_1 \sim k_6$) for the in-shot components of the substrate 10A, the measurement results at four points in the shot are used, and therefore, the solutions of the equations of the expressions (1), (2) are not obtained, so that it is possible to reduce the influence of the variation in the measurement results (that is, approximate residual errors by the linear models).

Having generated the lower-order components (correction coefficients $k_1 \sim k_6$) of the compensation data for the exposure apparatus 21 in the above-described manner, the built-in registration detection apparatus 11 outputs the lower-order components (correction coefficients $k_1 \sim k_6$) and measured values (registration discrepancy amounts (X1, Y1)) at each of the measurement points 10B to the factory host 24 via the machine controller 23. Further, the lower-order components (correction coefficients $k_1$~$k_6$) are outputted also to the database 13 from the built-in registration detection apparatus 11 and are stored therein so as to be referable from the stand-alone registration detection apparatus 12.

Here, the abovementioned lower-order components (correction coefficients $k_1$~$k_6$) outputted from the built-in registration detection apparatus 11 to the machine controller 23 are fed back to the exposure process and are used for the correction of the exposure process for a subsequent substrate 10A (substrate 10A to be transported to the exposure apparatus 21) in order to improve a nondefective ratio of a current lot. Incidentally, the machine controller 23 corrects the exposure process so as to reduce a process offset of the exposure process based on the abovementioned lower-order components (correction coefficients $k_1$~$k_6$).

On the detection stage 41 of the built-in registration detection apparatus 11, the substrates 10A after passing through the development process are placed in sequence, and the same registration detection as above is repeatedly performed for all (for example, 25 pieces of) the substrates 10A in the transport container 14 (total detection). Then, the lower-order components (correction coefficients $k_1$~$k_6$) of the compensation data generated for each of the substrates 10A are outputted to the machine controller 23 and the database 13. Further, the correction of the exposure process based on the lower-order components (correction coefficients $k_1$~$k_6$) is performed for each of the substrates 10A in the lot.

Then, when the lithography process (the resist coating process, the exposure process, the development process, and so on) and the detection process by the built-in registration detection apparatus 11 for all (for example, 25 pieces of) the substrates 10A in the transport container 14 are finished, the exposure apparatus 21 and the coater/developer 22 notify this to the factory host 24 via the machine controller 23. Further, when all the substrates 10A are collected in the transport container 14, the factory host 24 instructs the external automatic transport apparatus (not shown) or the operator to carry out the transport container 14 out of the loader/unloader part 31.

As described above, in the built-in registration detection apparatus 11 with a lower processing capability, the number of the measurement points of each of the substrates 10A is decreased (see FIG. 2), with the processing speed given a higher priority over accuracy of the registration detection, thereby enabling a reduction in a required time per one substrate, and consequently, it is possible to perform the registration detection at high speed without lowering an original throughput of the lithography system 20. Therefore, the correction of the exposure process can be performed for each substrate (realization of substrate-by-substrate correction).

Thereafter, when the transport container 14 carried out of the loader/unloader part 31 of the lithography system 20 is set in the stand-alone registration detection apparatus 12, this is notified to the factory host 24. The factory host 24 refers to the product name, the process name, and so on of the set transport container 14 to instruct detection criteria and so on suitable for the substrates 10A in the transport container 14. At this time, the factory host 24 outputs the product name, the process name, and the lot number of the lot to the stand-alone registration detection apparatus 12.

In the stand-alone registration detection apparatus 12, based on the instruction from the factory host 24, the recipe for the registration detection apparatus 12 (the file including the positional information of each of the measurement points 10C in FIG. 3) corresponding to the product name and the process name of the current lot is read from the database 13.

Then, when the substrate 10A newly taken out from the transport container 14 is placed on the detection stage 41, the measurement points 10C are aligned in sequence in a field of view of the apparatus according to the positional information registered in the recipe, and the registration detection is performed at the 52 measurement points 10C. Specifically, an image of each of the measurement points 10C is acquired, and registration discrepancy amounts (X2, Y2) at each of the measurement points 10C is calculated based on the image. The registration discrepancy amounts (X2, Y2) are stored in a memory of the image processing part 44 in correspondence to the positional coordinates (x, y) of each of the measurement points 10C. The registration discrepancy amounts (X2, Y2) correspond to "results of the registration detection performed by the second detection apparatus" in the claims.

Further, in the stand-alone registration detection apparatus 12, high-degree models represented by the following expressions (3), (4) are applied to the combination of the registration discrepancy amounts (X2, Y2), which are calculated at each of the 52 predetermined measurement points 10C, and the positional coordinates (x, y) of the measurement point 10C. $k_1$~$k_{12}$ in the expressions (3), (4) are correction coefficients and correspond to respective components of the compensation data of the exposure apparatus 21.

$$X2 = k_1 + k_2 \cdot x + k_3 \cdot y + k_7 \cdot x^2 + k_8 \cdot xy + k_9 \cdot y^2 \quad (3)$$

$$Y2 = k_4 + k_5 \cdot x + k_6 \cdot y + k_{10} \cdot x^2 + k_{11} \cdot xy + k_{12} \cdot y^2 \quad (4)$$

Then, the measurement results (the combination of the registration discrepancy amounts (X2, Y2) and the positional coordinates (x, y)) totally at the 52 points are analyzed according to the high-degree models, and the components (correction coefficients $k_1$~$k_{12}$) of the compensation data for the exposure apparatus 21 are calculated so as to reduce the influence of variation in the measurement results (that is, approximate residual errors by the high-degree models) to a minimum by using a least squares method or the like.

Incidentally, out of the components (correction coefficients $k_1$~$k_{12}$), the correction coefficients $k_1$~$k_6$ are the lower-order components of the compensation data for the exposure apparatus 21 previously described, and a major cause thereof is thought to be the expansion/contraction at the time of the thermal processing (exposure process) for the substrate 10A. Further, the correction coefficients $k_7$~$k_{12}$ are higher-order components of the compensation data for the exposure apparatus 21 and a cause thereof is thought to be a difference among apparatuses such as various manufacturing apparatuses including the exposure apparatus 21.

Further, the generation of the components (correction coefficients $k_1$~$k_{12}$) of the compensation data by the application of the high-degree models is performed for the inter-shot components (wafer components) of the substrate 10A. In this embodiment, as shown in FIG. 3, to generate the components (correction coefficients $k_1$~$k_{12}$) for the inter-shot components of the substrate 10A, the measurement results in 13 shots are used, and therefore, the solutions of the equations of the expressions (3), (4) are not obtained, and the influence of the variation in the measurement results (that is, approximate residual errors by the high-degree models) can be made very small.

As described above, after the built-in registration detection apparatus 11 generates the lower-order components (correction coefficients $k_1$~$k_6$), the stand-alone registration detection apparatus 12 performs the registration detection with high accuracy at more points than the built-in registration detection apparatus 11 to calculate the components (correction coefficients $k_1$~$k_{12}$) of the compensation data for the exposure apparatus 21. Then, out of the components (correction coefficients $k_1$~$k_{12}$), the lower-order components (correction coefficients $k_1$~$k_6$) stored in the database 13 are removed, whereby the higher-order components (correction coefficients $k_7$~$k_{12}$) are generated.

Having generated the higher-order components (correction coefficients $k_7$~$k_{12}$) of the compensation data for the exposure apparatus 21 in the above-described manner, the stand-alone registration detection apparatus 12 outputs the higher-order components (correction coefficients $k_7$~$k_{12}$) and the measured values (registration discrepancy amounts (X2, Y2)) at each of the measurement points 10C to the factory host 24. Consequently, the factory host 24 has the components (correction coefficients $k_1$~$k_{12}$) of the compensation data for the exposure apparatus 21 as well as the lower-order components (correction coefficients $k_1$~$k_6$) which have been already outputted from the built-in registration detection apparatus 11.

In this embodiment, the above-described registration detection by the stand-alone registration detection apparatus 12 is performed for one of the substrates 10A sampled from the transport container 14. When the above-described registration detection of the predetermined substrate 10A is finished, the stand-alone registration detection apparatus 12 notifies this to the factory host 24. Thereafter, the factory host 24 instructs the automatic transport apparatus (not shown) or the operator to carry out the transport container 14. Incidentally, the substrates are carried in a unit of lot to a subsequent process (processing process or the like) if judged as good as a result of the detection in the stand-alone registration detection apparatus, or to a reproduction process or a discard process if judged as bad.

In order to improve a nondefective ratio of a subsequent lot, the above-mentioned higher-order components (correction coefficients $k_7$~$k_{12}$) outputted from the stand-alone registration detection apparatus 12 to the factory host 24 are fed back to the exposure process via the machine controller 23 and are used for the correction of the exposure process for the substrates 10A in the subsequent lot. Incidentally, the machine controller 23 corrects the exposure process so as to reduce a process offset of the exposure process, based on the above-mentioned higher-order components (correction coefficients $k_7$~$k_{12}$).

As described above, in the stand-alone registration detection apparatus 12 with a higher processing capability, the number of the measurement points of each of the substrates 10A is increased (see FIG. 3), with accuracy of the registration detection given a higher priority over the processing speed, thereby enabling a reduction of the influence of the variation in the measurement results, so that accuracy of the registration detection can be enhanced. Therefore, higher accuracy of the correction of the exposure process is realized. Since the stand-alone registration detection apparatus 12 performs the sampling detection, an original throughput of the lithography system 20 is not lowered even if the number of the measurement points of the substrate 10A is increased.

In the registration detection system 10 of this embodiment, the built-in registration detection apparatus 11 with a lower processing capability is provided to generate the lower-order components (correction coefficients $k_1$~$k_6$) of the compensation data described above, which enables the substrate-by-substrate correction of the exposure process. Moreover, the stand-alone registration detection apparatus 12 with a higher processing capability is provided to generate the higher-order components (correction coefficients $k_4$~$k_{12}$) of the compensation data described above, which enables high accuracy correction of the exposure process in a unit of lot.

Therefore, in the registration detection system 10 of this embodiment, the built-in registration detection apparatus 11 and the stand-alone registration detection apparatus 12 work together, and with the maximum use of the processing capabilities of the both, it is possible to realize both the substrate-by-substrate correction and highly accurate correction of the exposure process without lowering the original throughput of the lithography system 20.

Incidentally, among variations of the process offset of the exposure process, variation relating to the higher-order components (correction coefficients $k_7$~$k_{12}$) is generally smaller than variation relating to the lower-order components (correction coefficients $k_1$~$k_6$). Therefore, as in the registration detection system 10 of this embodiment, by correcting the large variation relating to the lower-order components (correction coefficients $k_1$~$k_6$) in a unit of each substrate and by correcting the small variation relating to the higher-order components (correction coefficients $k_7$~$k_{12}$) in a unit of lot, it is possible to make the process offset of the exposure process fall within a stable range. Therefore, more stable manufacture of devices such as semiconductor devices is enabled.

Further, in the registration detection system 10 of this embodiment, after the lower-order components (correction coefficients $k_1$~$k_6$) of the compensation data are generated from the results (registration discrepancy amounts (X1, Y1)) of the registration detection by the built-in registration detection apparatus 11, the components (correction coefficients $k_1$~$k_{12}$) of the compensation data are calculated from the results (registration discrepancy amounts (X2, Y2)) of the registration detection by the stand-alone registration detection apparatus 12, and by removing the lower-order components (correction coefficients $k_1$~$k_6$) in the database 13 out of the components (correction coefficients $k_1$~$k_{12}$), the higher-order components (correction coefficients $k_7$~$k_{12}$) are generated, so that it is possible to avoid repeated feedback to the exposure process.

Modified Examples

The above embodiment has described the example where up to the quadratic term of the positional coordinates (x, y) of each of the measurement points 10C are used as the high-degree models when the stand-alone registration detection apparatus 12 analyzes a large number of the measurement results (see, the expressions (3), (4)), but the present invention is not limited to this. A cubic term or higher of the positional coordinates (x, y) may be included in the high-degree models, or an element such as an exponent or an element such as a scanning direction of a scanning exposure apparatus may be added.

Further, in the above embodiment, the measurement results in the 13 shots are used to generate the higher-order components (correction coefficients $k_1$7~$k_{12}$) for the inter-shot components of the substrate 10A, but the number of shots may be any number equal to 6 or more. Similarly, the measurement results in the 5 shots are used to generate the lower-order components (correction coefficients $k_1$~$k_6$) for the inter-shot components of the substrate 10A, but the number of the shots may be any number equal to 3 or more. Further, as for the in-shot components of the substrate 10A, the number of points in the shot may be 3.

Further, the above embodiment has described the example where the compensation data for the exposure apparatus 21 is generated by using only the measurement results of one substrate 10A, but the present invention is not limited to this. The compensation data for the exposure apparatus 21 may be generated by using an average value of the measurement results of the plural substrates 10A in a lot. In this case, the number of measured substrates in the stand-alone registration detection apparatus 12 is also 2 or more. Further, in the stand-alone registration detection apparatus 12, the compensation data for the exposure apparatus 21 may be generated by using an estimated value of the measurement result of a subsequent lot, which is obtained by estimating variation among lots from the past measurement results of a plurality of lots. The use of the average value or the estimated value can reduce the influence of data at a singular point of the variation, which enables more stable correction.

Further, the above embodiment has described the example where the compensation data for the exposure apparatus 21 is generated by the image processing part 44 of the built-in registration detection apparatus 11 and the image processing part 44 of the stand-alone registration detection apparatus 12, but the present invention is not limited to this. The machine controller 23 or the factory host 24 may generate the compensation data for the exposure apparatus 21 based on the measurement results (the combination of the registration discrepancy amounts and the positional coordinates of the measurement point) outputted to the machine controller 23 or the factory host 24. In this case, the machine controller 23 or the factory host 24 corresponds to the "generation unit" in the claims.

Further, in the above embodiment, the database 13 is installed outside the lithography system 20 and the registration detection system 10, but the present invention is not limited to this. The present invention may have a structure in which, by using at least one of memory units installed inside the built-in registration detection apparatus 11 and the stand-alone registration detection apparatus 12, data (detection results) are stored in this memory unit, and the other measurement detection apparatus is capable of writing and reading data thereto/therefrom. The two detection apparatuses (11, 12) may directly communicate with each other to compare two kinds of the detection results.

Further, in the above embodiment, the single built-in registration detection apparatus 11 and the single stand-alone registration detection apparatus 12 are provided, but at least either of the two detection apparatuses (11, 12) may be provided in plurality.

The invention is not limited to the above embodiments and various modifications may be without departing from the spirit and scope of the invention. Any improvement may be made in part or all of the components.

What is claimed is:

1. A registration detection system, comprising:
   a first detection apparatus that is installed on a pathway to a collection in a transport container of substrates that are taken out of said transport container, after passing at least through an exposure process and a development process, and performs registration detection of a resist pattern and a base pattern of said substrates after passing through said development process, at multiple points of said substrates;
   a second detection apparatus situated outside of said pathway, and performing registration detection of the resist pattern and the base pattern of said substrates at more points of said substrates than said first detection apparatus;
   a generation unit that generates compensation data for said exposure process based on results of the registration detection performed by said first detection apparatus and results of the registration detection performed by said second detection apparatus, and
   a controller coupled to said first detection apparatus and said second detection apparatus;
   wherein said first detection apparatus comprises:
   a first optical device for forming optical images on said substrates;
   a first image capturing device for generating first image signals from said optical images; and
   a first image processing unit for processing said first image signals and calculating a first detection result;
   wherein said second detection apparatus comprises:
   a second optical device for forming optical images on said substrates;
   a second image capturing device for generating second image signals; and
   a second image processing unit for processing said second image signals and calculating a second detection result; and
   wherein said controller:
   generates a first-order component from said first detection result;
   generates a second-order component from said second detection result; and
   calculates correction data from said first-order component and said second order component.

2. The registration detection system in claim 1, wherein said generation unit generates a lower-order component of said compensation data based on the results of the registration detection performed by said first detection apparatus, and generates a higher-order component of said compensation data based on the results of the registration detection performed by said second detection apparatus.

3. The registration detection system in claim 2, wherein said generation unit first generates said lower-order component and afterward calculates the respective components of said compensation data based the results of the registration detection performed by said second detection apparatus, with said lower-order component being removed from the respective components to generate said higher-order component.

4. The registration detection system in claim 1, wherein said first detection apparatus is placed inside an application/development apparatus that applies resist prior to said exposure process and develops said resist after said exposure process, and
   wherein said second detection apparatus is placed outside said application/development apparatus.

5. A system, comprising:
   a lithography system for performing a lithography process on a substrate;
   a first apparatus in the lithography system for performing registration detection of said substrate to generate a first detection result;
   a second apparatus outside of said lithography system for performing registration detection of said substrate to generate a second detection result; and
   a controller coupled to said first apparatus and said second apparatus, said controller generating a correction data for improving said lithography process,
   wherein said first apparatus comprises:
   a first optical device for forming optical images on said substrate;
   a first image capturing device for generating first image signals from said optical images; and a first image processing unit for processing said first image signals and calculating a first detection result;

wherein said second apparatus comprises:

a second optical device for forming optical images on said substrate;

a second image capturing device for generating second image signals; and a second image processing unit for processing said second image signals and calculating a second detection result; and wherein said controller:

generates a first-order component from said first detection result;

generates a second-order component from said second detection result; and calculates said correction data from said first-order component and said second-order component.

6. The system of claim 5, wherein said lithography system further comprises an exposure device, said correction data is used to offset said exposure device.

7. The system of claim 5, wherein said first apparatus is configured to:

position a plurality of measurement points in accordance with a predetermined recipe;

obtain images from said plurality of measurement points; and calculate a registration discrepancy for each of said plurality of measurement points to generate said first detection result.

8. The system of claim 7, wherein said calculate comprises applying a linear model to said registration discrepancies to obtain a first component of said correction data.

9. The system of claim 5, wherein said second apparatus is configured to:

position a plurality of measurement points in accordance with a predetermined recipe;

obtain images from said plurality of measurement points; and calculate a registration discrepancy for each of said plurality of measurement points to generate said second detection result.

10. The system of claim 9, wherein said calculate comprises applying a linear model to said registration discrepancies to obtain a second component of said correction data.

11. The system of claim 5, wherein said correction data is used to correct said lithography process for a subsequent substrate in the same lot of substrates.

12. The system of claim 5, wherein said correction data is used to correct said lithography process for a subsequent lot of substrates.

13. A registration detection system, comprising:

a first registration detection device in a lithography system for detecting registration of a first resist pattern formed on a substrate to a first reference pattern;

a second registration detection device outside of said lithography system for detecting registration of said resist pattern to a second reference pattern;

a memory device coupled to said first registration detection device and said second registration detection device for storing recipes for reference patterns; and a controller coupled to said first registration detection device and said second registration detection device;

wherein said first registration detection device comprises:

a first optical device for forming optical images on said substrate;

a first image capturing device for generating first image signals from said optical images; and a first image processing unit for processing said first image signals and calculating a first detection result;

wherein said second registration detection device comprises:

a second optical device for forming optical images on said substrate;

a second image capturing device for generating second image signals; and a second image processing unit for processing said second image signals and calculating a second detection result; and wherein said controller:

generates a first-order component from said first detection result;

generates a second-order component from said second detection result; and calculates correction data from said first-order component and said second order component.

14. The system of claim 13, wherein the processing capability of said first registration detection device is less than the processing capability of said second registration detection device.

15. The system of claim 13, wherein said first registration detection device prioritizes processing speed over registration detection precision.

16. The system of claim 13, wherein said second registration detection device prioritizes registration detection precision over processing speed.

17. The system of claim 13, wherein said recipe comprises at least one of location data, index elements, and scan direction for a plurality of measurement points on said substrate, each recipe referencing a predetermined identification data.

18. The system of claim 13, wherein said memory device stores correction data generated by said first registration detection device and/or said second registration detection device.

19. A registration detection system, comprising:

a first overlay measurement device in a substrate treatment system for generating a first data for correcting exposure process for substrates in a first lot;

a second overlay measurement device outside the substrate treatment system for generating a second data for correcting exposure process for substrates in a second lot; and a controller coupled to said first overlay measurement device and said second overlay measurement device;

wherein said first overlay measurement device comprises:

a first optical device for forming optical images on said substrates;

a first image capturing device for generating first image signals from said optical images; and a first image processing unit for processing said first image signals and calculating a first detection result;

wherein said second overlay measurement device comprises:

a second optical device for forming optical images on said substrates;

a second image capturing device for generating second image signals; and a second image processing unit for processing said second image signals and calculating a second detection result; and wherein said controller:

generates a first-order component from said first detection result;

generates a second-order component from said second detection result; and calculates correction data from said first-order component and said second order component.

20. The system of claim 19, wherein measurement data from a plurality of substrates within said first lot are averaged to generate said first data.

21. The system of claim 19, wherein measurement data from one substrate within said first lot is used to generate said first data for correcting exposure process for a subsequent substrate in said first lot.

22. The system of claim 19, wherein said second data comprises projected value.

23. A method of measuring registration, comprising:
performing registration detection on a substrate using a first apparatus, said first apparatus being in a lithography system;
generating a first component from a first detection result by said first apparatus;
performing registration detection on said substrate using a second apparatus, said second apparatus being outside the lithography system;
generating a second component from a second detection result by said second apparatus;
calculating a correction data from said first detection result and/or said second detection result;
forming optical images on said substrate via a first optical device of the first apparatus;
generating first image signals from said optical images via a first image capturing device of the first apparatus;
processing said first image signals and calculating a first detection result via a first image processing unit of the first apparatus;
forming optical images on said substrate via a second optical device of the second apparatus;
generating second image signals via a second image capturing device of the second apparatus;
processing said second image signals and calculating a second detection result via a second image processing unit of the second apparatus;
generating a first-order component from said first detection result;
generating a second-order component from said second detection result; and
calculating correction data from said first-order component and said second order component.

24. The method of claim 23, further comprising:
transporting said substrate to said lithography system;
applying a resist to said substrate;
exposing said resist to form an image on said resist; and
developing said resist to form said image on said substrate.

25. The method of claim 24, further comprising:
calculating an offset between said image and a base pattern using said first detection result; and
performing a correction using a said offset to said image prior to said exposing.

26. The method of claim 25, wherein said performing comprises:
taking measurements at a first plurality of locations on said substrate;
wherein each of said first plurality of locations comprises a first resist mark indicating a reference position in a first resist pattern and a first base mark indicating a reference position in a first base pattern.

27. The method of claim 26, further comprising calculating a first relative discrepancy between said first resist mark and said first base mark for each of said first plurality of locations.

28. The method of claim 26, further comprising:
taking measurements at a second plurality of locations on said substrate;
wherein each of said second plurality locations comprises a second resist mark indicating a reference position in a second resist pattern and a second base mark indicating a reference position in a second base pattern.

29. The method of claim 28, further comprising calculating a relative discrepancy between said second resist mark and said second base mark for each of said second plurality of locations.

30. The method of claim 28, wherein the number of said first plurality of locations differs from the number of said second plurality of locations.

31. The method of claim 23, further comprising offsetting an exposure device using said correction data.

* * * * *